(12) United States Patent
Ghoshal

(10) Patent No.: US 6,429,665 B1
(45) Date of Patent: Aug. 6, 2002

(54) CIRCUIT FOR DETECTING AN IMPEDANCE CHANGE AT A CIRCUIT INPUT

(75) Inventor: Uttam Shyamalindu Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/157,893

(22) Filed: Sep. 21, 1998

(51) Int. Cl.$^7$ ................................................ G01R 27/26
(52) U.S. Cl. ........................ 324/664; 324/649; 324/691; 365/189.01
(58) Field of Search ................................ 324/664, 689, 324/649, 691, 694; 382/124; 62/132; 365/189.01, 189.11

(56) References Cited

U.S. PATENT DOCUMENTS

| | | | |
|---|---|---|---|
| 4,761,769 A | * 8/1988 | Saito | 365/230 |
| 4,879,681 A | * 11/1989 | Miwa et al. | 365/189.01 |
| 5,835,420 A | * 11/1998 | Lee et al. | 365/189.09 |

OTHER PUBLICATIONS

Carver Mead, "Analog VLSI and Neural Systems", Addison–Wesley Publishing, Part III, Dynamic Functions, pp. 194–197, 1989.

Dan Strassberg, "Biometrics: You Are Your Password", *EDN*, pp. 47–58, May 7, 1998.

\* cited by examiner

*Primary Examiner*—N. Le
*Assistant Examiner*—T. R. Sundaram
(74) *Attorney, Agent, or Firm*—Casimer K. Salys; Bracewell & Patterson, L.L.P.

(57) ABSTRACT

An impedance detection circuit includes a circuit input having a first contact and a second contact, a reference voltage rail coupled to the first contact, and a memory cell having a data node coupled to the second contact and an output. When the memory cell is read, the logic state of the output provides an indication of an impedance coupling the first and second contacts at the circuit input. The impedance detection circuit can be utilized to sense resistive and capacitive inputs and has any number of applications, including use as a digital hygrometer and as a fingerprint sensor.

21 Claims, 3 Drawing Sheets

CIRCUIT FOR DETECTING AN IMPEDANCE CHANGE AT A CIRCUIT INPUT

BACKGROUND OF THE INVENTION

1. Technical Field

The present invention relates in general to electrical circuitry and, in particular, to an electrical circuit for detecting an impedance at a circuit input.

2. Description of the Related Art

Currently, complementary metal-oxide semiconductor (CMOS) technology is nearly universally used to fabricate memories and other electronic components that require high switching speed and low power consumption. As integrated circuit fabrication techniques have continued to improve, it has been possible to produce integrated circuits having ever smaller feature sizes and increasing performance. However, recently there has been a growing realization that CMOS technology has fundamental scaling limitations and that diminishing performance enhancements are gained by standard geometric scaling. Accordingly, there is currently great interest in operating CMOS systems at sub-ambient temperatures to extract greater performance from current design points.

When operating a CMOS system at sub-ambient temperature, practical system reliability concerns dictate that no moisture be permitted to condense on the surfaces of system boards and low temperature cooling assemblies. Thus, it is imperative to maintain such surfaces at a temperature greater than the dew point of water vapor. In conventional systems intended for operation at sub-ambient temperatures, optical hygrometers such as that depicted in FIG. 1 are utilized for dew point detection.

As shown in FIG. 1, a conventional optical hygrometer 10 includes two optical channels, a control channel 12 and a detection channel 14, that each contain a light emitting diode (LED) 16 and a photodetector (PD) 18. In control channel 12, the amount of light emitted by LED 16 that is received by photodetector 18 is controlled by an optical balance 22, which determines how far opaque barrier 20 extends into control channel 12. Light emitted by LED 16 of detection channel 14, on the other hand, is received by photodetector 18 after being reflected by a mirror 24 located on a cooled surface for which temperature control is desired. An output of each of photodetectors 18 is connected to an input of differential amplifier 26, which generates an amplified output that forms an input to a defrost control circuit.

In operation, optical hygrometer 10 is first calibrated through the adjustment of optical balance 22 when mirror 24 is free from condensation such that the output of differential amplifier 26 is essentially zero. Then, as the surface on which mirror 24 is cooled below the dew point, moisture will begin to condense on mirror 24, scattering the light emitted by LED 16 in detection channel 14 and causing a differential voltage to develop between the inputs of differential amplifier 26. Thus, when condensation reaches a level determined by the setting of optical balance 22, differential amplifier 26 signals the defrost control signal that condensation has formed on the cooled surface and that remedial action, such as heating the cooled surface, is required.

While conventional optical hygrometers such as that illustrated in FIG. 1 are effective in providing an imprecise indication of the condensation of moisture on a cooled surface, such conventional optical hygrometers are subject to a number of drawbacks. First, conventional optical hygrometers tend to be expensive and bulky. It is therefore inconvenient and costly to utilize a large number of optical hygrometers in a practical computer system. In addition, conventional optical hygrometers cannot be used to detect moisture condensation over small surface areas. Second, conventional optical hygrometers do not generate digital output signals. Optical hygrometers therefore cannot easily be integrated into or interconnected with conventional digital circuitry, for example, to permit the gathering of statistical data pertaining to moisture condensation. Third, conventional optical hygrometers have poor sensitivity to the formation of condensation. As a result, damage can result to system components if the optical balance is calibrated incorrectly.

As should thus be apparent, it would be useful and desirable to provide an improved hygrometer for detecting moisture condensation in a computer system operating at sub-ambient temperature.

SUMMARY OF THE INVENTION

In accordance with the present invention, an impedance detection circuit is provided that includes a circuit input having a first contact and a second contact, a reference voltage rail coupled to the first contact, and a memory cell having a data node coupled to the second contact and an output. When the memory cell is read, the logic state of the output provides an indication of an impedance coupling the first and second contacts at the circuit input. The impedance detection circuit can be utilized to sense resistive and capacitive inputs and has any number of applications, including use as a digital hygrometer and as a fingerprint sensor.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
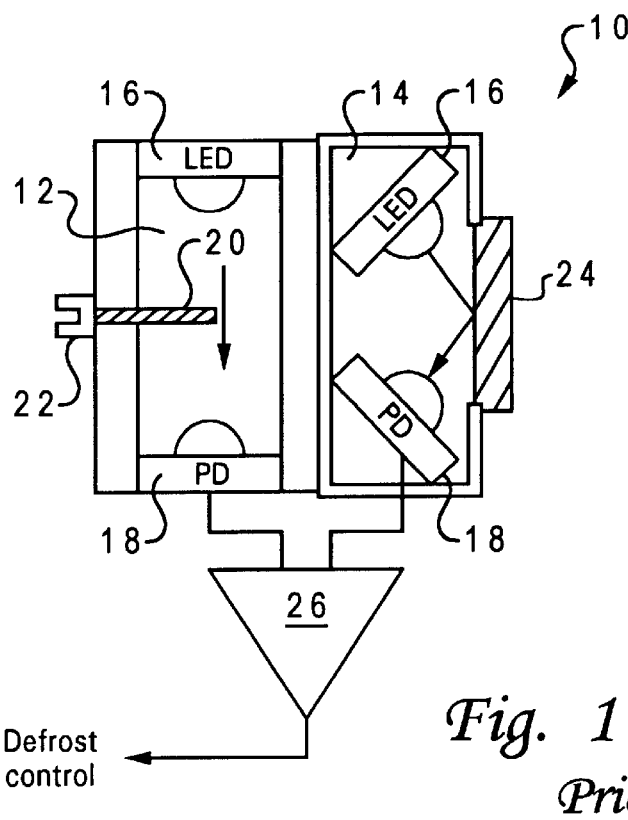
FIG. 1 illustrates a conventional optical hygrometer.
Figure 2:
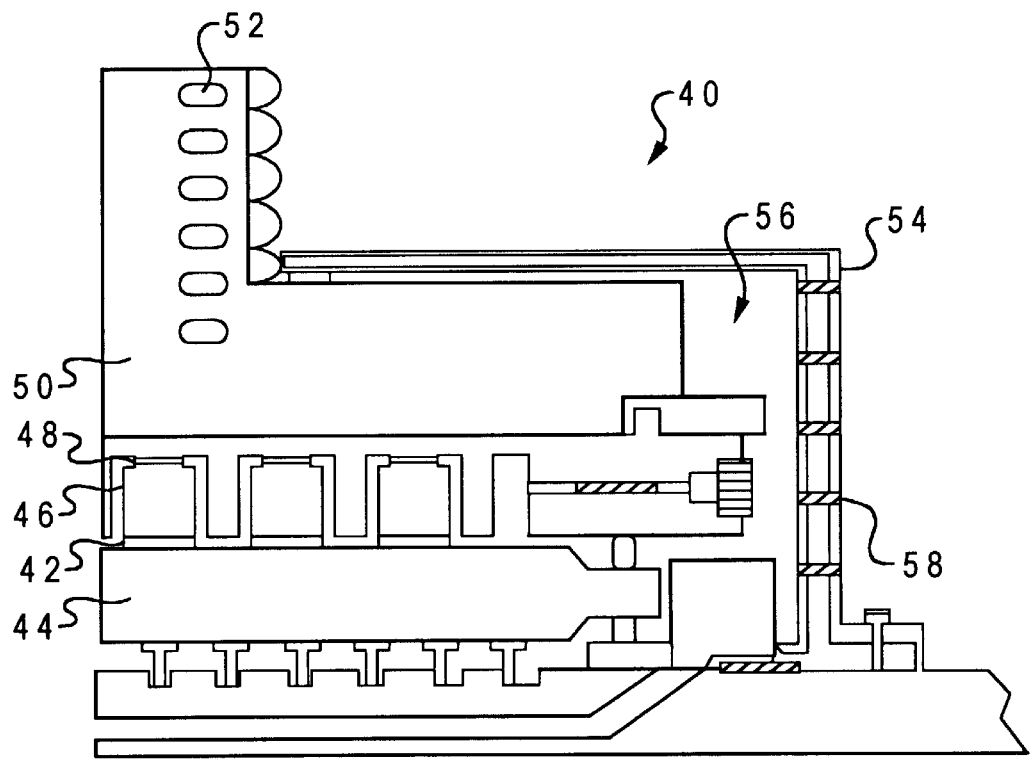
FIG. 2 depicts a sub-ambient temperature computing environment in which an impedance detection circuit in accordance with the present invention may advantageously be utilized as a digital hygrometer.

With reference again to the figures and in particular with reference to FIG. 2, there is depicted a sub-ambient temperature computing environment in which an impedance detection circuit in accordance with the present invention may advantageously be utilized as a digital hygrometer. Computing environment 40 may be implemented, for example, as a mainframe computer, such as the S/390 manufactured by International Business Machines Corporation of Armonk, N.Y. As illustrated, computing environment 40 includes a plurality of integrated circuit chips 42, which may each comprise a processor, a memory or other type of CMOS device. Each of integrated circuit chips 42 is forced against a substrate 44 by a respective piston 46 that is urged downwardly from cold chuck 50 by an associated spring 48. Cold chuck 50 is refrigerated to a sub-ambient temperature by circulating a refrigerant through channels 52 formed within cold chuck 50.

To extract high performance from integrated circuit chips 42, integrated circuit chips 42 are refrigerated to a sub-ambient temperature, which may be approximately −50° C. or less. In order to achieve such a low operating temperature, integrated circuit chips 42 and a portion of cold chuck 50 are enclosed by a vacuum chamber wall 54 to form a partial vacuum chamber 56, and helium (He) is circulated in the voids between substrate 44 and cold chuck 50. Because of the temperature differential between the interior and exterior of partial vacuum chamber 56, moisture will condense on vacuum chamber wall 54 if the temperature of vacuum chamber wall 54 is less than the dew point of water vapor, which is approximately 10° C. under normal atmospheric pressure. Accordingly, defrost control circuitry (not illustrated) selectively passes current through multiple defrost resistors 58 located in vacuum chamber wall 54 to evaporate moisture that has condensed on vacuum chamber wall 54.

Figure 3:
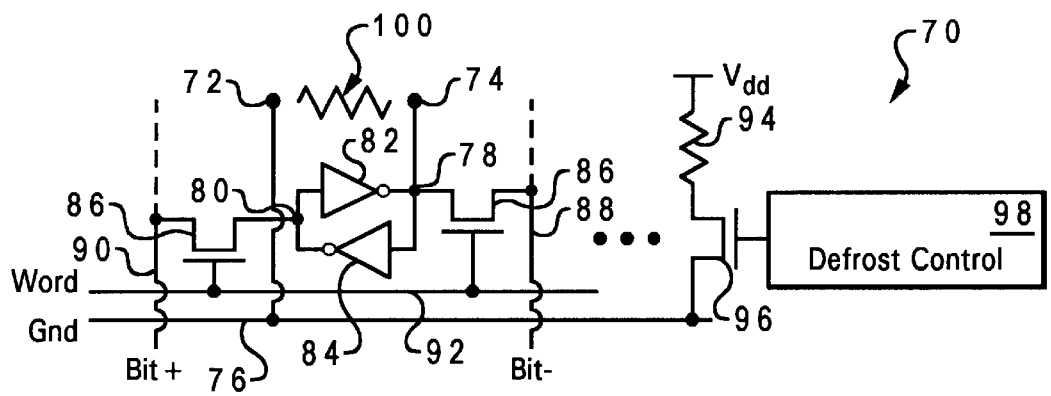
FIG. 3 depicts a first illustrative embodiment of an impedance detection circuit in accordance with the present invention.

The efficient operation of defrost resistors 58 requires detection of the presence of condensation on vacuum chamber wall 54, such that defrost resistors 58 are "turned on" when condensation is present and are "turned off" when the condensation has evaporated. Referring now to FIG. 3, there is depicted a first illustrative embodiment of an impedance detection circuit that may advantageously be utilized as a digital hygrometer for detecting the presence of condensation. Impedance detection circuit 70 is CMOS integrated circuit that can be fabricated in a semiconductor substrate by a conventional CMOS process utilized to manufacture large scale memory chips. Thus, although only a single impedance detection circuit 70 is illustrated in FIG. 3 for the sake of clarity, it should be understood that numerous impedance detection circuits may be fabricated in the semiconductor substrate to form an array analogous to a memory array.

As shown, each impedance detection circuit 70 in the array has a circuit input, including a metallized ground contact 72 and a metallized data contact 74, which is formed on the upper surface of the substrate. Ground contact 72 is connected to ground voltage rail 76, and data contact 74 is connected to a data node 78 internal to impedance detection circuit 70. Between data node 78 and intermediate node 80, inverters 82 and 84 are connected in a parallel feedback configuration. As a result, the logic state of intermediate node 80 is always inverted with respect to the logic state of data node 78. Each of nodes 78 and 80 is further coupled to a respective one of bit lines 88 and 90 by an associated N-type output transistor 86. The gate of each of output transistors 86 is connected to word line 92 such that when word line 92 is fired the logic states of data node 78 and intermediate node 80 are output on bits lines 88 and 90, respectively. As further indicated in FIG. 3, one or more impedance detection circuits 70 may have a local defrost resistor 94 coupled in series with a defrost transistor 96 between $V_{dd}$ and ground voltage rail 76.

In operation, an array containing a plurality of impedance detection circuits 70 is mounted to or formed in a surface, such as vacuum chamber wall 54, for which condensation detection is desired. When the surface of the substrate in which the array of impedance detection circuits 70 is formed is dry, data node 78 of each impedance detection circuit is initialized to a high logic state (i.e., a "1") by a standard memory write (i.e., bit line 88 is set to a high logic state, bit line 90 is set to a low logic state, and word line 92 is strobed). Thereafter, if a dew drop 100 condenses between contacts 72 and 74 of an impedance detection circuit 70, data node 78 of that circuit will be discharged to low logic state (i.e., "0") as if the dew drop were a large resistor coupling contacts 72 and 74. Thus, the condensation of water vapor on the surface of the array can be detected by defrost control circuitry 98 through continuously reading the logic states of nodes 78 and 80 of various impedance detection circuits 70 within the array. In response to the detection of condensation at a particular location within the array, defrost control circuitry 98 can evaporate dew drop 100 by energizing the gate of defrost transistor 96, thereby causing current to flow through the local defrost resistor 94.

Figure 4:
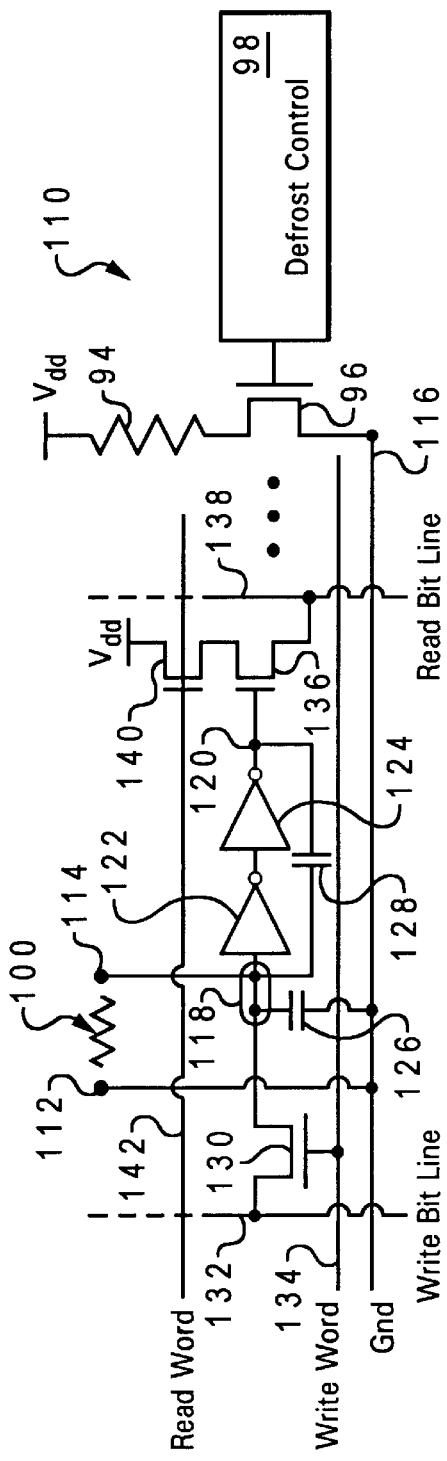
FIG. 4 depicts a second illustrative embodiment of an impedance detection circuit in accordance with the present invention.

Referring now to FIG. 4, there is depicted a second illustrative embodiment of an impedance detection circuit that may advantageously be utilized as a digital hygrometer for detecting the presence of condensation. Like impedance detection circuit 70 of FIG. 3, impedance detection circuit 110 of FIG. 4 is a CMOS integrated circuit that can be fabricated in a semiconductor substrate as a cell of a detection array utilizing a conventional CMOS memory array fabrication process. Thus, although only a single impedance detection circuit 110 is illustrated in FIG. 4 for the sake of clarity, it should be understood that numerous impedance detection circuits 110 may be fabricated within the substrate to form an array, as indicated by ellipsis notation.

Like impedance detection circuit 70, impedance detection circuit 110 has a circuit input, including a metallized ground contact 112 and a metallized data contact 114, which is formed on the upper surface of the substrate. Ground contact 112 is connected to ground voltage rail 116, and data contact 114 is connected to a data node 118 internal to impedance detection circuit 110. Data node 118 is coupled to an intermediate node 120 by a pair of series-connected inverters 122 and 124 and is coupled to ground voltage rail 116 by a first capacitor 126 and to intermediate node 120 by a second capacitor 128. Data node 118 is further connected to the data output of input transistor 130, which has a data input connected to write bit line 132 and a control input (gate) connected to write word line 134. The logic state of data node 118 can be set by setting write bit line 132 to the desired logic state and strobing write word line 134. The logic state of intermediate node 120 can be read out via output transistor 136, which is connected in series with a read control transistor 140 between $V_{dd}$ and read bit line 138 and has a control input (gate) connected to intermediate node 120. If intermediate node 120 has a high logic state when read word line 142 is strobed, output transistor 136 is turned on, and read bit line 138 is driven to a high logic state. Conversely, if intermediate node 120 has a low logic state, output transistor 136 remains turned off when read word line 142 is asserted, and read bit line 138 remains logic low. Finally, like impedance detection circuit 70 of FIG. 3, one or more impedance detection circuits 110 in the array may have an associated local defrost resistor 94 coupled in series with a defrost transistor 96 between $V_{dd}$ and ground voltage rail 76.

When employed as a digital hygrometer, an array containing a plurality of impedance detection circuits 110 is mounted to or formed in a surface for which condensation detection is desired. As described above, data node 118 of each impedance detection circuit 110 within the array is initialized to a high logic state (i.e., a "1") while the surface of the substrate in which the array is formed is dry. Following initialization, each impedance detection circuit 110 can be modeled as a capacitive voltage divider circuit. To illustrate this point, FIG. 5A depicts a capacitive voltage divider circuit 150 that approximates the behavior of an initialized impedance detection circuit 110. In FIG. 5A, node $V_{in}$ corresponds to data node 118, node $V_{out}$ corresponds to intermediate node 120, amplifier A corresponds to inverters 122 and 124, capacitors $C_1$ corresponds to capacitor 126, and capacitor $C_2$ provides positive feedback like capacitor 128.

Figure 5B:
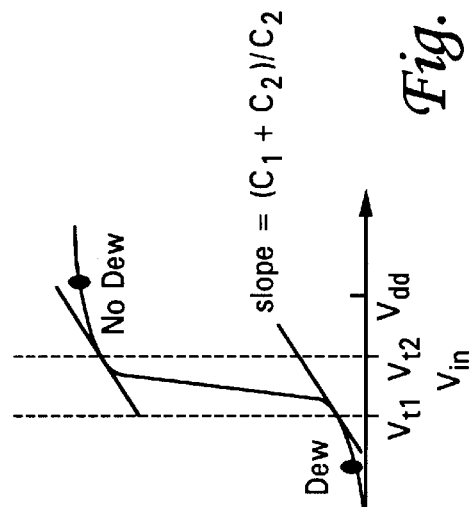
FIGS. 5A and 5B respectively illustrate a capacitive voltage divider circuit and its transfer function.
Figure 5A:
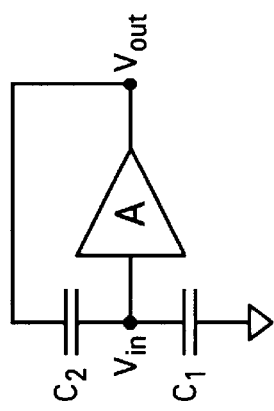

FIG. 5B depicts the transfer characteristic of capacitive voltage divider circuit 150. As illustrated, capacitive voltage divider circuit 150 has a gain less than 1 if $V_{in}<V_{t1}$ or if $V_{in}>V_{t2}$. Thus, as $V_{in}$ approaches 0 from $V_{t1}$, $V_{out}$ asymptotically approaches 0. Similarly, as $V_{in}$ approaches $V_{dd}$ from $Vt_2$, $V_{out}$ asymptotically approaches $V_{dd}$. However, when $V_{t1} \leq V_{in} \leq Vt_2$, capacitive voltage divider circuit 150 has a gain greater than or equal to the fraction $(C_1+C_2)/C_2$, which has a minimum value of 1.

To complete the model, it is important to understand the electrical properties of water. At ambient temperatures and pressures, pure water is a poor conductor and has a high dielectric constant ($\in$) of approximately 80. Accordingly, a dew droplet condensing between contacts 112 and 114 can accurately be modeled as a large capacitor connected in parallel with capacitor 126 (i.e., capacitor $C_1$) between data node 118 and ground voltage rail 116.

As indicated in FIG. 5B, when impedance detection circuit 110 is initialized to a high logic state (i.e., at or near $V_{dd}$), intermediate node 120, which corresponds to node $V_{out}$ of voltage divider circuit 150, has a high logic state. Then, when a dew drop forms between contacts 112 and 114, charge begins to leak to ground from data node 118, decreasing the voltage at data node 118 to $Vt_2$, at which point the gain of impedance detection circuit 110 is effectively $(C_{dew}+C_1+C_2)/C_2$. As a result, impedance detection circuit 110 "fires" and the voltage at intermediate node 120 drops precipitously from a high logic state to a low logic state. Thus, the condensation of water vapor on the surface of the array can be detected by defrost control circuitry 98 through continuously reading the logic states of intermediate node 120 of various impedance detection circuits 110 within the array. In response to the detection of condensation at a particular location within the array, defrost control circuitry 98 can evaporate dew drop 100 by energizing the gate of defrost transistor 96, thereby causing current to flow through the local defrost resistor 94.

If a conventional CMOS fabrication technique for memory arrays is used to manufacture an array of impedance detection circuits in accordance with the present invention, each impedance detection circuit in the array may measure approximately 3 microns by 3 microns, and the surface contacts may be separated by a distance of approximately 2–4 microns. Assuming an average dew drop is approximately 100 microns in diameter, the formation of a single dew drop will likely be detected by a large number of impedance detection circuits. Additional statistics regarding the size of dew drops forming on a surface can be gathered by varying the spacing of the surface contacts in various impedance detection circuits in the array.

Figure 6:
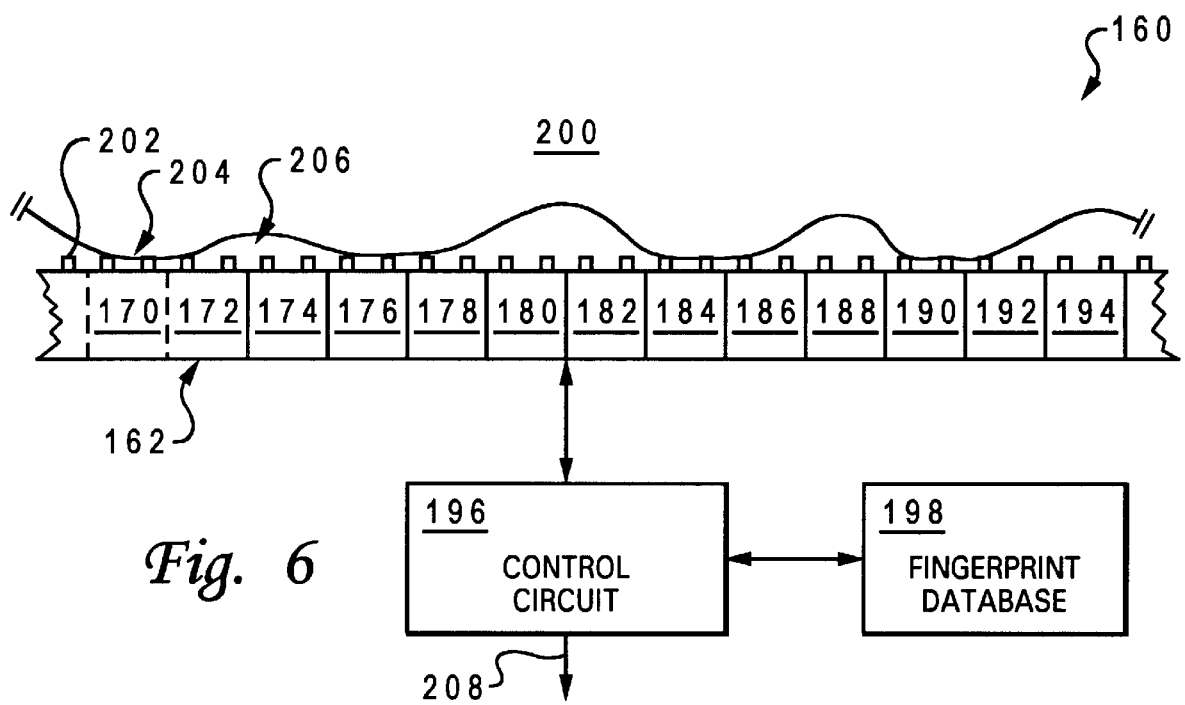
FIG. 6 depicts an authentication device in which an impedance detection circuit in accordance with the present invention is advantageously utilized as a fingerprint sensor.

Although impedance detection circuits in accordance with the present invention have been described above with respect to implementations in which such circuits are utilized as digital hygrometers, it should be understood that the impedance detection circuits are applicable to impedance detection generally and may therefore be employed in any number of other applications. For example, with reference now to FIG. 6, there is illustrated an authentication device in which an array of impedance detection circuits in accordance with the present invention is advantageously utilized as a fingerprint sensor. As depicted, authentication device 160 includes a integrated circuit 162 containing a two-dimensional array of impedance detection circuits 170–194 in accordance with the present invention. Impedance detection circuits 170–194 can each be implemented with one of the embodiments shown in FIGS. 3 and 4 or an alternative embodiment. Integrated circuit 162 is coupled to a control circuit 196, which is further coupled to a fingerprint database 198 that stores fingerprint data (e.g., a right thumb print) of authenticated individuals.

Prior to an attempt to authenticate an individual, control circuit 196 initializes each impedance detection circuit in integrated circuit 162. After an individual's finger 200 touches at least some of the contacts 202 formed on the surface of integrated circuit 162, control circuit 196 senses which impedance detection circuits in the array have detected a fingerprint ridge 204. For example, in the depicted example, impedance detection circuits 170, 176, 184, and 190 will indicate that a fingerprint ridge 204 has been detected. By comparing the pattern of fingerprint ridges 204 and/or valleys 206 that are detected across the two-dimensional array against prestored fingerprint patterns in fingerprint database 198, control circuit 196 can determine if the individual can be authenticated. The authentication or non-authentication of the individual can then be signalled, for example, to an associated data processing system, via authentication signal 208.

As has been described, the present invention provides an improved circuit for detecting the presence of an impedance at a circuit input. An impedance detection circuit in accordance with the present invention may advantageously be produced utilizing conventional CMOS memory fabrication techniques, yielding a digital circuit that not only has a low per unit cost, but also has good sensitivity and small overall dimensions.

While the invention has been particularly shown and described with reference to a preferred embodiment, it will be understood by those skilled in the art that various changes in form and detail may be made therein without departing from the spirit and scope of the invention. For example, although the present invention has been described with respect to illustrative embodiments in which an impedance detection circuit is implemented with static logic, it should understood that an impedance detection circuit in accordance with the present invention could alternatively be implemented with dynamic logic.

What is claimed is:

1. A system for detecting surface impedance, comprising:
 a plurality of first contacts and a plurality of second contacts, wherein said plurality of first contacts and said plurality of second contacts are disposed in a pattern on a surface;
 a plurality of memory cells respectively coupled between pairs of first and second contacts, each memory cell having an output, wherein each memory cell generates a first output state at its output in an absence of a surface impedance coupling its respective first and second contacts and generates a different second output state in response to a presence of a surface impedance coupling its respective first and second contacts;

means for biasing memory cells to a selected one of said first and second output states; and a control circuit coupled to detect output states generated by said plurality of memory cells.

2. The system of claim 1, and further comprising a substrate in which said system is formed of integrated circuitry, said substrate having the surface on which said plurality of first contacts and said plurality of second contacts are located.

3. The system of claim 1, wherein said plurality of memory cells comprise static memory cells.

4. The system of claim 1, wherein said second output state indicates the presence of a resistance coupling said first contact and said second contact.

5. The system of claim 4, wherein each of said plurality of memory cells comprises:

a data node and a second node;

first and second inverters coupled in parallel between said data node and said second node;

a first bit line and a second bit line; and a first transistor coupled between said data node and said first bit line and a second transistor coupled between said second node and said second bit line.

6. The system of claim 1, wherein said second output state provides an indication of a capacitance coupling said first contact and said second contact.

7. The system of claim 6, wherein each of said plurality of memory cells comprises:

a data node;

a first capacitor coupled between said data node and said reference voltage rail;

an output transistor having a control input;

a second capacitor coupled between said data node and said control input of said output transistor; and one or more inverters coupled in parallel with said second capacitor.

8. The system of claim 1, and further comprising a defrost resistor controlled by said control circuit in response to outputs of said plurality of memory cells.

9. The system of claim 1, wherein said plurality of memory cells are arranged in a two-dimensional array.

10. The circuit of claim 1, and further comprising the impedance, wherein the impedance intermittently couples the first and second contacts.

11. The circuit of claim 5, wherein said data node is coupled between said second contact and said output.

12. A digital hygrometer, comprising:

a substrate having a surface;

an impedance detection circuit including:

a plurality of first contacts and a plurality of second contacts, wherein said plurality of first contacts and said plurality of second contacts are formed on said surface;

a plurality of memory cells respectively coupled between pairs of first and second contacts, each memory cell having an output, wherein each memory cell generates a first output state at its output in an absence of a surface impedance coupling its respective first and second contacts and generates a different second output state in response to a presence of a surface impedance coupling its respective first and second contacts;

means for biasing memory cells to a selected one of said first and second output states; and a control circuit coupled to detect output states generated by said plurality of memory cells.

13. The digital hygrometer of claim 12, wherein said impedance detection circuit is an integrated circuit formed within said substrate.

14. The digital hygrometer of claim 12, wherein said impedance detection circuit is formed from static logic.

15. The digital hygrometer of claim 12, wherein each of said plurality of memory cells comprises:

a data node and a second node;

first and second inverters coupled in parallel between said data node and said second node;

a first bit line and a second bit line; and a first transistor coupled between said data node and said first bit line and a second transistor coupled between said second node and said second bit line.

16. The digital hygrometer of claim 12, wherein each of said plurality of memory cells comprises:

a first capacitor coupled between said data node and said reference voltage rail;

an output transistor having a control input;

a second capacitor coupled between said data node and said control input of said output transistor; and one or more inverters coupled in parallel with said second capacitor.

17. The digital hygrometer of claim 15, wherein said data node is coupled between said second contact and said output.

18. A defrost control system, said defrost control system comprising:

a digital hygrometer in accordance with claim 12; and a defrost resistor;

wherein said control circuit comprises defrost control circuitry coupled to said defrost resistor, wherein said defrost control circuitry causes current to flow through said defrost resistor in response to detecting an impedance coupling at least one set of first and second contacts.

19. A method for detecting surface impedance comprising:

initializing each of a plurality of memory cells to a selected one of first and second output states, wherein each of said plurality of memory cells has respective first and second contacts disposed in a pattern on a surface;

after initializing said plurality of memory cells, sensing output states at outputs of said plurality of memory cells, wherein a first output state at a memory cell output indicates absence of a surface impedance coupling its respective first and second contacts and a different second output state indicates a presence of a surface impedance coupling its respective first and second contacts; and detecting a presence or absence of a surface impedance based upon output states of said plurality of memory cells.

20. The method of claim 19, wherein said initializing step comprises performing a standard memory write operation.

21. The method of claim 19, wherein said sensing step comprises performing a standard memory read operation.

* * * * *